US012727521B2

(12) United States Patent
Huang et al.

(10) Patent No.: US 12,727,521 B2
(45) Date of Patent: Sep. 1, 2026

(54) SEMICONDUCTOR STRUCTURE AND MANUFACTURING METHOD THEREOF

(71) Applicant: AP Memory Technology Corporation, Hsinchu County (TW)

(72) Inventors: Chung-Chiang Huang, HsinChu (TW); Kee-Wei Chung, HsinChu (TW); Ru-Yi Cai, HsinChu (TW)

(73) Assignee: AP Memory Technology Corporation, Hsinchu County (TW)

( * ) Notice: Subject to any disclaimer, the term of this patent is extended or adjusted under 35 U.S.C. 154(b) by 357 days.

(21) Appl. No.: 18/621,004

(22) Filed: Mar. 28, 2024

(65) Prior Publication Data

US 2025/0309203 A1 Oct. 2, 2025

(51) Int. Cl.

| | |
|---|---|
| ***H10W 90/00*** | (2026.01) |
| ***H10W 74/10*** | (2026.01) |
| *H10W 72/00* | (2026.01) |
| *H10W 72/20* | (2026.01) |

(52) U.S. Cl.

CPC .......... *H10W 90/00* (2026.01); *H10W 74/114* (2026.01); *H10W 72/0198* (2026.01); *H10W 72/072* (2026.01); *H10W 72/07338* (2026.01); *H10W 72/241* (2026.01); *H10W 72/884* (2026.01); *H10W 90/722* (2026.01); *H10W 90/732* (2026.01); *H10W 90/752* (2026.01)

(58) Field of Classification Search

CPC ............... H10W 90/00; H10W 74/114; H10W 72/0198; H10W 72/072; H10W 72/07338; H10W 72/241; H10W 72/884; H10W 90/722; H10W 90/732; H10W 90/752; H10W 72/50; H10B 10/12; H10B 10/18

See application file for complete search history.

(56) References Cited

U.S. PATENT DOCUMENTS

| | | | | |
|---|---|---|---|---|
| 7,679,928 B2 * | 3/2010 | Kim | H10W 72/30 | 361/767 |
| 2002/0039316 A1 | 4/2002 | Tobita | | |

FOREIGN PATENT DOCUMENTS

| | | |
|---|---|---|
| TW | 201027692 | 7/2010 |

OTHER PUBLICATIONS

"Office Action of Taiwan Counterpart Application", issued on Mar. 19, 2025, p. 1-p. 7.

* cited by examiner

*Primary Examiner* — David Vu

(74) *Attorney, Agent, or Firm* — JCIPRNET

(57) ABSTRACT

A semiconductor structure including a semiconductor die, a component layer and a pseudo static random access memory (PSRAM) die is provided. The component layer is disposed on the surface of the semiconductor die, wherein the component layer includes an organic layer. The PSRAM die is disposed on the surface of the semiconductor die and is electrically connected to the semiconductor die. A manufacturing method of a semiconductor structure is also provided.

20 Claims, 7 Drawing Sheets

SEMICONDUCTOR STRUCTURE AND MANUFACTURING METHOD THEREOF

BACKGROUND

Technical Field

The disclosure relates to a semiconductor structure and a manufacturing method thereof.

Description of Related Art

System on chip (SoC) is an integrated circuit that integrates a plurality of electronic components with different functions into one chip. Therefore, an electronic product including the SoC can be configured to have relatively small size and deliver the high performance.

In order to improve the computing efficiency, forming an embedded memory in the SoC is adopted. In detail, there is a static random access memory (SRAM) circuits or a dynamic random access memory (DRAM) circuits embedded in the SoC. However, forming the embedded memory in the SoC not only increases the manufacturing cost and complexity of the manufacturing process, but also limits the area and/or performance of the integrated circuits in the SoC.

For example, referring to FIG. 6A and FIG. 6B, which shows an existing light-emitting element module 1000 in which an embedded memory 4 and a light-emitting unit 2 are integrated in a SoC 1, wherein the embedded memory 4 is an SRAM and the light-emitting unit 2 is covered by a passivation layer 3. The SRAM is a memory with 6 transistors, 8 transistors, 10 transistors or more, which has a relatively large area and occupies the area of other integrated circuits in the SoC 1, so that the SOC 1 have the poor performance. If the size of other integrated circuits in the SoC 1 is retained, the SoC 1 will be larger in size and have higher manufacturing cost.

Furthermore, the SRAM and the DRAM have higher power consumption, which will degrade the user experience when using the electronic product including the SRAM and/or the DRAM.

SUMMARY

The disclosure provides a semiconductor structure having smaller size and/or better performance, and having the reduced power consumption.

The semiconductor structure provided by the disclosure comprises a semiconductor die, a component layer and a pseudo static random access memory (PSRAM) die. The component layer is disposed on a surface of the semiconductor die, wherein the component layer comprises an organic layer. The PSRAM die is disposed on the surface of the semiconductor die and is electrically connected to the semiconductor die.

The disclosure provides a manufacturing method of a semiconductor structure, wherein the semiconductor structure has smaller size and/or better performance, and has the reduced power consumption.

The manufacturing method of the semiconductor structure provided by the disclosure comprises the following steps. Providing a pseudo static random access memory (PSRAM) wafer. Dicing the PSRAM wafer to form a plurality of PSRAM dies. Bonding the PSRAM die to a surface of a semiconductor die, wherein a component layer and a passivation layer are disposed on the surface of the semiconductor die, and the component layer comprises an organic layer.

Based on the above, by attaching the PSRAM die to the semiconductor die, the size and/or performance of the integrated circuit in the semiconductor die may not be limited. Namely, the semiconductor structure provided by the disclosure have smaller size and/or better performance. Furthermore, the memory integrated in the semiconductor structure provided by the disclosure is the PSRAM, which has the advantages including the low cost and large capacity of DRAM and the operating interface of SRAM, so the semiconductor structure has the reduced power consumption.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The following examples are listed and described in detail with accompanying drawings, but the provided examples are not intended to limit the scope of the disclosure. In addition, the drawings are for illustrative purposes only and are not drawn to original size. To facilitate understanding, the same elements will be identified with the same symbols in the following description.

Figure 1:
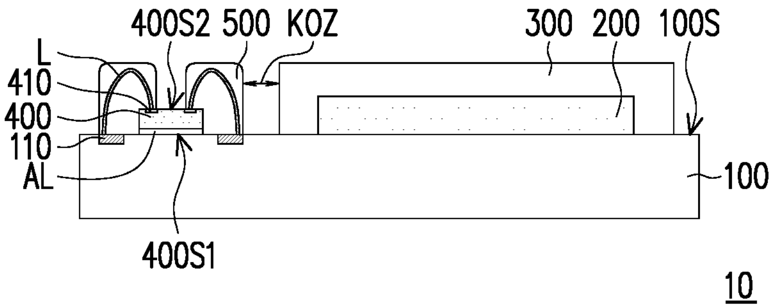
FIG. 1 is a partial cross-sectional schematic diagram of a semiconductor structure according to a first embodiment of the disclosure.

FIG. 1 is a partial cross-sectional schematic diagram of a semiconductor structure according to a first embodiment of the disclosure.

Referring to FIG. 1, which shows a structure of a semiconductor structure 10. In the present embodiment, the semiconductor structure 10 comprises a semiconductor die 100, a component layer 200, a passivation layer 300, and a pseudo static random access memory (PSRAM) die 400.

In the present embodiment, the semiconductor die 100 comprises a display driver integrated circuit (DDIC) for driving a light-emitting unit disposed thereon. Namely, the semiconductor structure 10 of the present embodiment may be integrated with the light-emitting unit and the memory unit. Based on the above, the semiconductor structure 10 may be applied in the art of augmented reality glasses and/or virtual reality glasses, but the disclosure is not limited thereto. In other embodiments, the semiconductor die 100 may comprise a microcontroller unit (MCU), true wireless Bluetooth, edge artificial intelligence (edge-AI), or other suitable electronic components. A material of the semiconductor die 100 may comprise silicon, silicon germanium, silicon-on-insulator, or other suitable semiconductor materials, and the disclosure is not limited thereto. In the present embodiment, a plurality of contact pads 110 are disposed on a surface 100S of the semiconductor die 100. The plurality of contact pads 110 may be used to bond the semiconductor die 100 to another die (eg, a PSRAM die 400 to be described later).

The component layer 200 is disposed on the surface 100S of the semiconductor die 100. In the present embodiment, the component layer 200 comprises an organic layer. In detail, the component layer 200 comprises a microorganic light emitting diode (micro OLED). For example, the component layer 200 may comprise an organic light-emitting layer (not shown), a first electrode (not shown), and a second electrode (not shown). The organic light-emitting layer may comprise a light-emitting layer, an electron injection layer, an electron transport layer, a hole transport layer and/or a hole injection layer, but the disclosure is not limited thereto. The first electrode may be disposed on a surface of the organic light-emitting layer close to the semiconductor die 100, and the second electrode may be disposed on a surface of the organic light-emitting layer far away from the semiconductor die 100. In some embodiments, the component layer 200 may further comprise at least one insulating layer for electrical isolation, wherein the at least one insulating layer may comprise organic materials, inorganic materials, or a combination thereof.

The passivation layer 300 is disposed on the component layer 200, and covers the component layer 200. In some embodiments, a material of the passivation layer 300 may comprise glass, metal, metal oxide, or a combination thereof. In the present embodiment, the material of the passivation layer 300 comprises glass. The passivation layer 300 may be used to prevent oxygen and/or moisture introduced from the outside from entering the component layer 200, thereby inhibiting the oxidation occurred in the organic light-emitting layer and/or the electrodes, which may reduce the possibility of dark spots appearing in the light-emitting area of the component layer 200.

The PSRAM die 400 is disposed on the surface 100S of the semiconductor die 100. PSRAM is a memory having the interface in the static random access memory (SRAM) and the core in the dynamic random access memory (DRAM). In detail, the PSRAM die 400 has an interface protocol similar to that of the SRAM, which may achieve access by giving an address, a read command and/or a write command, rather than controlling the memory cells to refresh data at regular intervals by utilizing the controller in the DRAM. Furthermore, the core of the PSRAM adopts the architecture of the DRAM; that is, the memory cell in the PSRAM may be composed of one transistor and one capacitor, rather than includes more than six transistors. Based on the above, compared to the SRAM including at least six transistors, the PSRAM has a smaller size and/or a larger storage capacity. Therefore, the PSRAM may combine the advantages of SRAM and DRAM.

Figure 7:
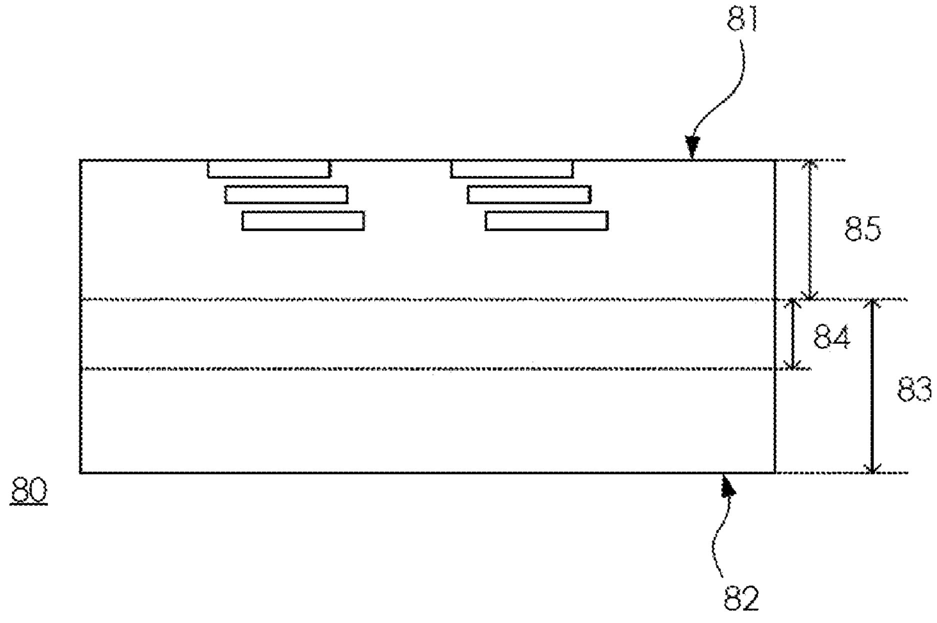
FIG. 7 shows a definition of a face side and a back side of a semiconductor die or a semiconductor wafer.

In the present embodiment, the PSRAM die 400 is attached to the semiconductor die 100. In detail, an adhesive layer AL disposed on a surface 400S1 of the PSRAM die 400 may be used to make the surface 400S1 of the PSRAM die 400 adhere to the surface 100S of the semiconductor die 100, and a plurality of contact pads 410 disposed on a surface 400S2 of the PSRAM die 400 may be used to bond the PSRAM die 400 to the surface 100S of the semiconductor die 100, wherein the surface 400S1 of the PSRAM die 400 faces the surface 100S of the semiconductor die 100, and the surface 400S2 of the PSRAM die 400 is far away from the surface 100S of the semiconductor die 100. The surface 400S2 is an active surface of the PSRAM die 400; that is, the plurality of contact pads 410 and/or other connecting component may be disposed on the surface 400S2. It is noted that, "the active surface" (also known as a face side) of the PSRAM die 400 means a surface on which the back-end-of-line (BEOL) is formed, and the opposite side of the active surface is a back side of the semiconductor die 100. For the purpose of illustration, FIG. 7 shows a definition of the face side and the back side of a semiconductor die or a semiconductor wafer, which would be described in the following embodiment. The adhesive layer AL may be a die attach film (DAF), an AA glue, or other suitable adhesive layer, and the disclosure is not limited thereto. In the present embodiment, the plurality of contact pads 410 disposed on the surface 400S2 of the PSRAM die 400 are bonded to (electrically connected to) the contact pads 110 disposed on the semiconductor die 100 through performing a wire bonding process. In detail, the plurality of contact pads 410 of the PSRAM die 400 and the corresponding pads 110 of the semiconductor die 100 may be bonded to each other through a plurality of metal wires L. Based on the above, the PSRAM die 400 may be electrically connected to the semiconductor die 100 and/or components in the component layer 200. In the present embodiment, the semiconductor die 100 comprises the DDIC, and the DDIC is arranged to drive the component layer 200 by using the PSRAM die 400. For example, the semiconductor die 100 is arranged to access the PSRAM die 400 through the metal wires L. In some embodiments, the component layer 200 comprises the microorganic light emitting diodes, and the semiconductor die 100 is arranged to control the microorganic light-emitting diodes by accessing the PSRAM die 400.

In the present embodiment, a keep out zone KOZ is formed between the PSRAM die 400 and the component layer 200 to isolate the PSRAM die 400 from the component layer 200. In detail, the keep out zone KOZ is a zone in which there is no semiconductor component, and is used for separating the component layer 200 from the PSRAM die 400 by air.

In some embodiments, the semiconductor structure 10 may further comprise a molding layer 500. The molding layer 500 covers the plurality of contact pads 110 of the semiconductor die 100 and the plurality of contact pads 410 of the PSRAM die 400, and surrounds the plurality of metal wires L to provide the effect of sealing protection. A material of the molding layer 500 may be a potting paste or other suitable material, and the disclosure is not limited thereto.

Figure 2:
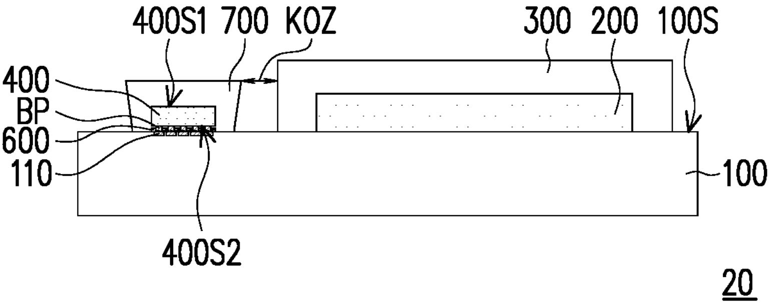
FIG. 2 is a partial cross-sectional schematic diagram of a semiconductor structure according to a second embodiment of the disclosure.

FIG. 2 is a partial cross-sectional schematic diagram of a semiconductor structure according to a second embodiment of the disclosure. It should be noted that the embodiment of FIG. 2 may use the reference numbers and portions of the content of the embodiment of FIG. 1, wherein the same or similar reference numbers are used to represent the same or similar elements, and descriptions of the same technical contents are omitted.

Referring to FIG. 2, the main difference between the semiconductor structure 20 and the above semiconductor structure 10 is that there are plurality of bumps BP disposed on the surface 400S2 of the PSRAM die 400, and the plurality of bumps BP disposed on the PSRAM die 400 are bonded to the plurality of contact pads 110 disposed on the semiconductor die 100 through a flip-chip bonding process.

In detail, in the present embodiment, the semiconductor structure 20 further comprises a conductive film 600 and a plurality of bumps BP. The conductive film 600 is disposed between the PSRAM die 400 and the semiconductor die 100, and the plurality of bumps BP are disposed on the surface 400S2 of the PSRAM die 400. In the present embodiment, the surface 400S2 (the active surface) of the PSRAM die 400 faces the semiconductor die 100. Therefore, the conductive film 600 may contact the plurality of bumps BP disposed on the surface 400S2 of the PSRAM die 400 and the plurality of contact pads 110 of the semiconductor die 100, so that the plurality of bumps BP of the PSRAM die 400 and corresponding contact pads 110 of the semiconductor die 100 may be electrically connected to each other through the conductive film 600.

In the present embodiment, the conductive film 600 comprises an anisotropic conductive film, wherein the anisotropic conductive film comprises conductive particles and insulating materials. Since the anisotropic conductive film comprises the conductive particles, when the PSRAM die 400 and the semiconductor die 100 are bonded to (electrically connected to) each other through the flip-chip bonding process, the anisotropic conductive film located between the PSRAM die 400 and the semiconductor die 100 is squeezed, causing the conductive particles to deform and contact the plurality of bumps BP and the corresponding contact pads 110, so that there is an electrical path between the PSRAM die 400 and the semiconductor die 100. Furthermore, the insulating material may be used to fix the PSRAM die 400 disposed on the semiconductor die 100.

In addition, in the present embodiment, the semiconductor structure 20 further comprises an encapsulation layer 700. The encapsulation layer 700 is disposed on the semiconductor die 100 and surrounds the PSRAM die 400 and the plurality of bumps BP to achieve the effect of sealing protection. Furthermore, the encapsulation layer 700 exposes the surface 400S1 of the PSRAM die 400. A material of the encapsulation layer 700 may be epoxy resin or other suitable material, and the disclosure is not limited thereto.

Figure 3:
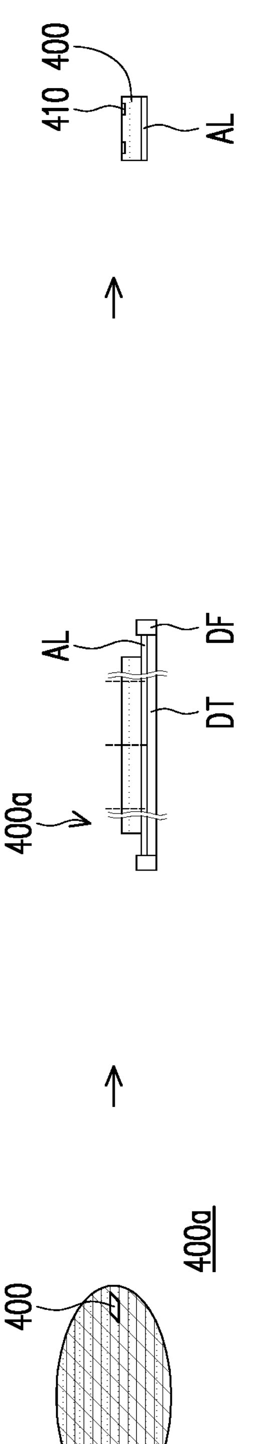
FIG. 3 is a schematic flowchart of a manufacturing method of the semiconductor structure according to the first embodiment of the disclosure.
Figure 3:
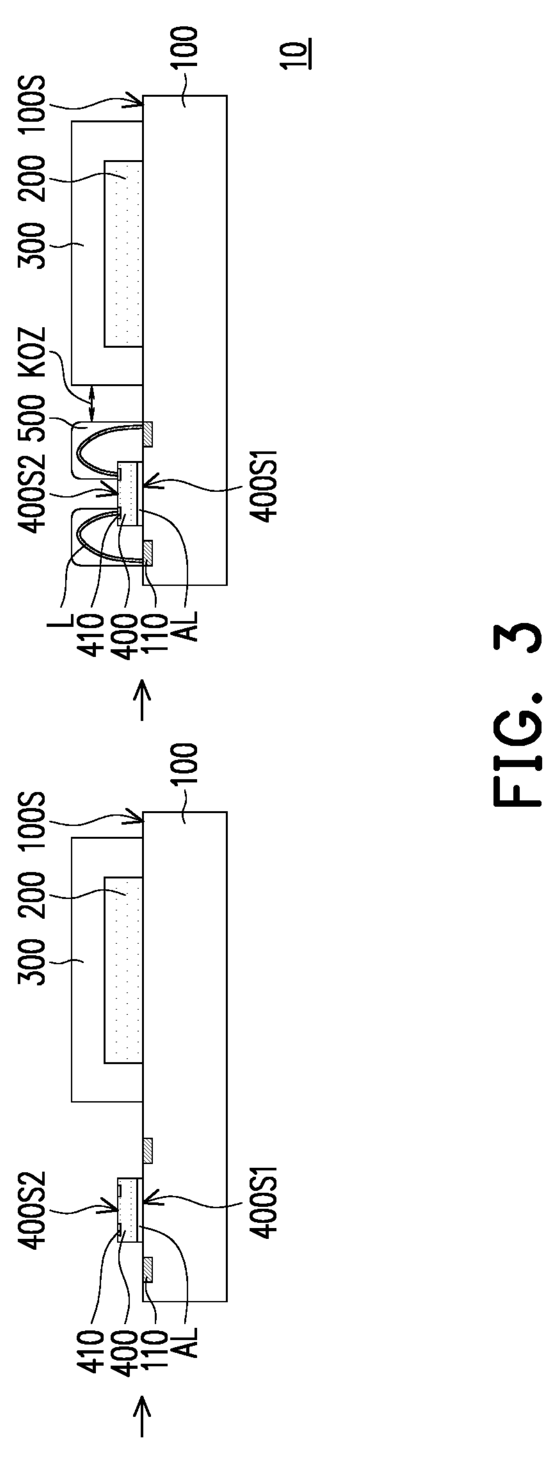

FIG. 3 is a schematic flowchart of a manufacturing method of the semiconductor structure according to the first embodiment of the disclosure. It should be noted that the embodiment of FIG. 3 may use the reference numbers and portions of the content of the embodiment of FIG. 1, wherein the same or similar reference numbers are used to represent the same or similar elements, and descriptions of the same technical contents are omitted.

Referring to FIG. 3, firstly, providing a PSRAM wafer **400*a*, which comprises a plurality of PSRAM dies 400 to be diced. The introduction to the PSRAM die 400** had been described in the foregoing embodiments and would be omitted in this embodiment.

Secondly, placing the PSRAM wafer **400*a* on a dicing tape DT, wherein the surface 400S1 of the PSRAM die 400 to be diced faces the dicing tape DT. The PSRAM wafer 400*a*** may be fixed on the dicing tape DT through the adhesive layer AL. The introduction of the adhesive layer AL had been described in the foregoing embodiments and would be omitted in this embodiment. In the present embodiment, providing a dicing frame DF surrounding the dicing tape DT to fix the dicing tape DT.

Afterwards, dicing the PSRAM wafer **400*a* to form the plurality of PSRAM dies 400. In the present embodiment, the PSRAM wafer 400*a* may be diced by a wafer dicing device (not shown), but the disclosure is not limited thereto. Since the PSRAM wafer 400*a* is fixed on the dicing tape DT, the plurality of PSRAM dies 400 may still be neatly arranged on the dicing tape DT after the PSRAM wafer 400*a*** is diced.

Then, separating the plurality of PSRAM dies 400 and the dicing tape DT. The plurality of PSRAM dies 400 and the dicing tape DT may be separated by performing a suitable separation process, and the present disclosure is not limited thereto. In the present embodiment, after the plurality of PSRAM dies 400 and the dicing tape DT are separated, the adhesive layer AL is still disposed on the surface 400S1 of the PSRAM die 400.

Next, performing a wire bonding process to bond the plurality of contact pads 410 disposed on the surface 400S2 of the PSRAM die 400 to the corresponding contact pads 110 disposed on the semiconductor die 100. The wire bonding process may comprise the following steps, but the disclosure is not limited thereto.

(1) Bonding the PSRAM die 400 to the semiconductor die 100 through the adhesive layer AL disposed on the surface 400S1, wherein the surface 400S1 is opposite to the active surface. The surface 400S2 is the active surface of the PSRAM die 400; that is, the plurality of contact pads 410 and/or other connecting component may be disposed on the surface 400S2. It is noted that, "the active surface" (the face side) of the PSRAM die 400 means a surface on which the back-end-of-line (BEOL) is formed, and the opposite side of the active surface is a back side of the semiconductor die 100, which would be described in the following embodiment shown in FIG. 7. In some embodiments, the adhesive layer AL is cured at a temperature below 100° C. to bond the PSRAM die 400 to the semiconductor die 100. In the present embodiment, the component layer 200 and the passivation layer 300 had been disposed on the semiconductor die 100. The introduction of the component layer 200 and the passivation layer 300 had been described in the foregoing embodiments and would be omitted in this embodiment. In addition, in the present embodiment, a keep out zone KOZ is formed between the PSRAM die 400 and the component layer 200 to isolate the PSRAM die 400 from the component layer 200. It is worth mentioned that the thermal budget generated by bonding the PSRAM die 400 to the semiconductor die 100 may be reduced by using the ionizer fan or passing the gas, but the disclosure is not limited thereto.

(2) Forming a plurality of metal wires L electrically connected to the plurality of contact pads 410 of the PSRAM die 400 and corresponding contact pads 110 of the semiconductor die 100, so that the PSRAM die 400 and the semiconductor die 100 may be bonded to each other through the plurality of metal wires L. Based on the above, the PSRAM die 400 may be electrically connected to the semiconductor die 100 and/or the components in the component layer 200.

After that, forming a molding layer 500 to cover the plurality of contact pads 110 of the semiconductor die 100 and the plurality of contact pads 410 of the PSRAM die 400, wherein the molding layer 500 surrounds the plurality of metal wires L to provide the effect of sealing protection. In some embodiments, the molding layer 500 is formed by curing at a temperature below 100° C.

At this point, the fabrication of the semiconductor structure 10 is completed. Although the manufacturing method of the semiconductor structure 10 of the present embodiment is explained by taking the above method as an example, the disclosure is not limited thereto.

Figure 4:
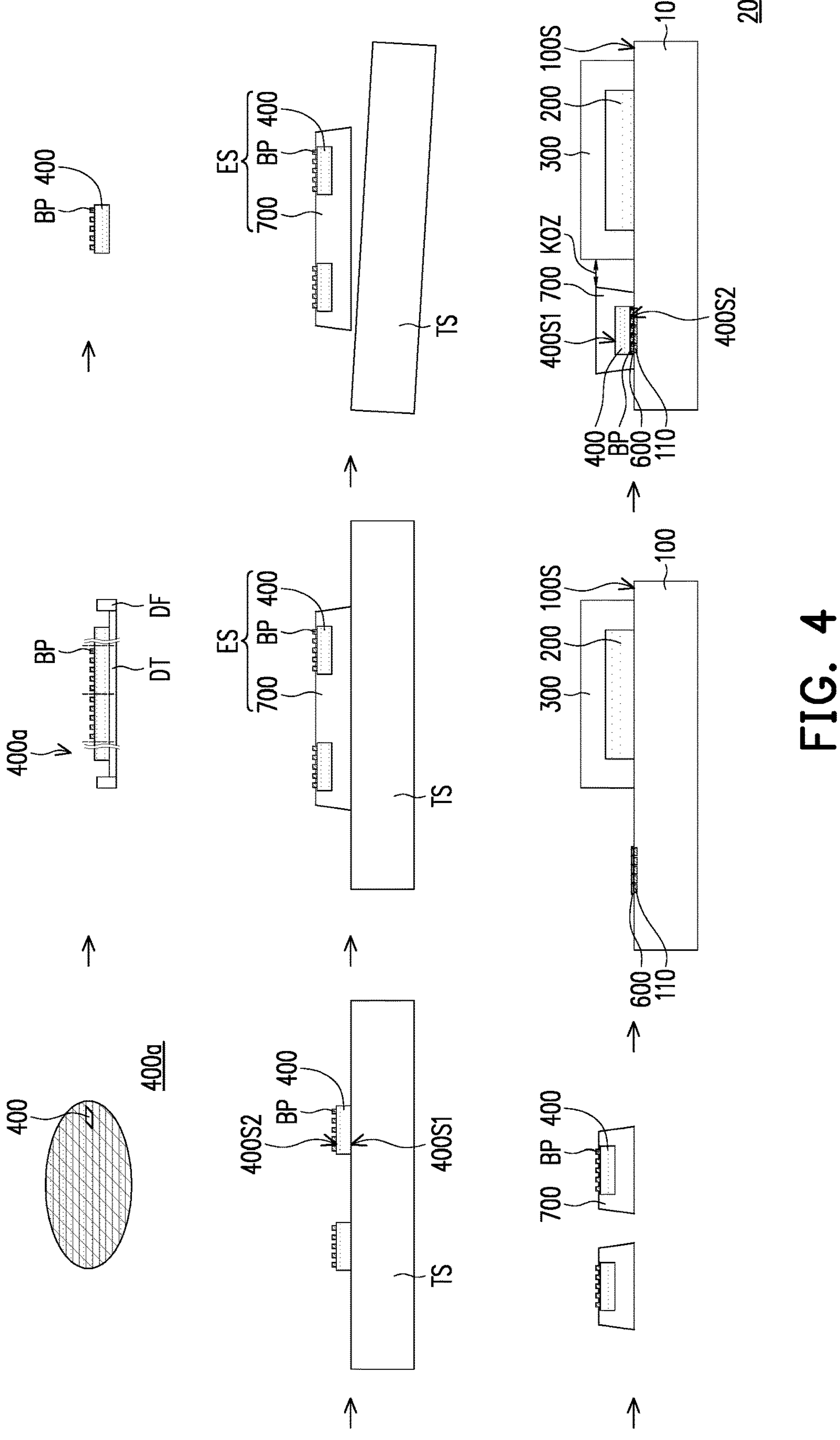
FIG. 4 is a schematic flowchart of a manufacturing method of the semiconductor structure according to the second embodiment of the disclosure.

FIG. 4 is a schematic flowchart of a manufacturing method of the semiconductor structure according to the second embodiment of the disclosure. It should be noted that the embodiment of FIG. 4 may use the reference numbers and portions of the content of the embodiment of FIG. 2, wherein the same or similar reference numbers are used to represent the same or similar elements, and descriptions of the same technical contents are omitted.

Referring to FIG. 4, firstly, providing a PSRAM wafer 400*a*, which comprises a plurality of PSRAM dies 400 to be diced. The introduction to the PSRAM wafer 400*a* had been described in the foregoing embodiments and would be omitted in this embodiment.

Secondly, forming a plurality of bumps BP on the surface 400S2 of the plurality of PSRAM dies to be diced, respectively. The plurality of bumps BP may be formed by performing an electroplating process, but the disclosure is not limited thereto.

Afterwards, placing the PSRAM wafer 400*a* on a dicing tape DT, wherein the surface 400S1 of the PSRAM die 400 to be diced faces the dicing tape DT and is fixed on the dicing tape DT.

Then, dicing the PSRAM wafer 400*a* to form the plurality of PSRAM dies 400. In the present embodiment, the PSRAM wafer 400*a* may be diced by a wafer dicing device (not shown), but the disclosure is not limited thereto. Since the PSRAM wafer 400*a* is fixed on the dicing tape DT, the plurality of PSRAM dies 400 may still be neatly arranged on the dicing tape DT after the PSRAM wafer 400*a* is diced.

Then, separating the plurality of PSRAM dies 400 and the dicing tape DT. The plurality of PSRAM dies 400 and the dicing tape DT may be separated by performing a suitable separation process, and the present disclosure is not limited thereto.

Then, disposing the plurality of PSRAM dies 400 on a temporary substrate TS, wherein the surface 400S1 of the plurality of PSRAM dies 400 faces the temporary substrate TS. Namely, the plurality of PSRAM dies 400 are disposed on the temporary substrate TS in a face-up manner. In some embodiments, the plurality of PSRAM dies 400 may be bonded to the temporary substrate TS through a die adhesive film (not shown), but the disclosure is not limited thereto.

Then, forming an encapsulation layer 700 on the temporary substrate TS to form an encapsulation structure ES, wherein the encapsulation structure ES comprises the plurality of PSRAM dies 400 and the encapsulation layer 700, and the encapsulation layer 700 surrounds the plurality of PSRAM dies 400 and exposed a portion of the plurality of bumps BP. The method of forming the encapsulation layer 700 may comprise performing the following steps. Firstly, forming an encapsulating material layer (not shown) surrounding and covering the plurality of PSRAM dies 400 formed on the temporary substrate TS, wherein the encapsulating material layer may be formed by performing a molding process or other suitable process, and the disclosure is not limited thereto. Secondly, performing a planarization process (such as a grinding process) on the encapsulation material layer until the plurality of bumps BP are exposed to form the encapsulation layer 700. A material of the encapsulation layer 700 may be epoxy resin, but the disclosure is not limited thereto.

Then, separating the encapsulation structure ES from the temporary substrate TS. The encapsulation structure ES and the temporary substrate TS may be separated by performing a suitable separation process, and the disclosure is not limited thereto.

Then, cutting the encapsulation structure ES to form the plurality of PSRAM dies 400 surrounded by the encapsulation layer 700. In the present embodiment, the encapsulation structure ES may be cut by performing a suitable cutting process, and the disclosure is not limited thereto.

Next, performing a flip-chip bonding process to bond the plurality of bumps BP disposed on the surface 400S2 of the PSRAM die 400 to the plurality of contact pads 110 disposed on the surface 100S of the semiconductor die 100. The flip-chip bonding process may comprise the following steps, but the disclosure is not limited thereto.

(1) Forming a conductive film 600 covering the plurality of contact pads 110 disposed on the surface 100S of the semiconductor die 100. (2) Laminating the PSRAM die 400 to the conductive film 600 at a temperature of approximately 140° C. for several seconds, wherein an active surface (surface 400S2) of the PSRAM die 400 faces the surface 100S of the semiconductor die 100, so that the PSRAM die 400 may be bonded to the semiconductor die 100 through the conductive film 600. In detail, in the present embodiment, the conductive film 600 comprises an anisotropic conductive film. Since the anisotropic conductive film comprises the conductive particles, when the PSRAM die 400 and the semiconductor die 100 are bonded to each other through the flip-chip bonding process, the anisotropic conductive film located between the PSRAM die 400 and the semiconductor die 100 is squeezed, causing the conductive particles to deform and contact the plurality of bumps BP and the corresponding contact pads 110, so that there is an electrical path between the PSRAM die 400 and the semiconductor die 100.

In the present embodiment, the component layer 200 and the passivation layer 300 had been disposed on the semiconductor die 100. The introduction of the component layer 200 and the passivation layer 300 had been described in the foregoing embodiments and would be omitted in this embodiment.

At this point, the fabrication of the semiconductor structure 20 is completed. Although the manufacturing method of the semiconductor structure 20 of the present embodiment is explained by taking the above method as an example, the disclosure is not limited thereto.

Figure 5A:
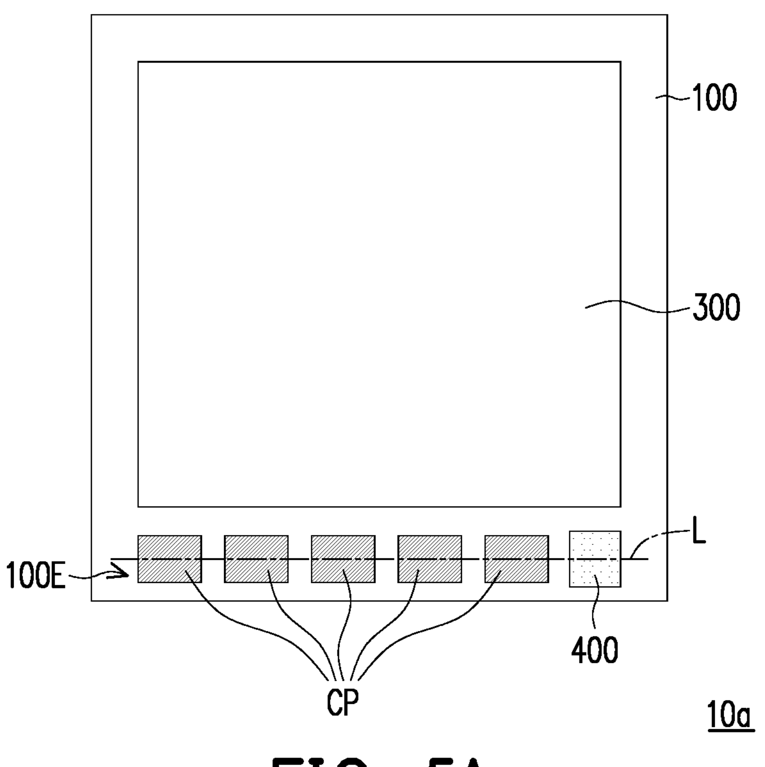
FIG. 5A is a top-view diagram of the semiconductor structure according to one embodiment of FIG. 1.
Figure 5B:
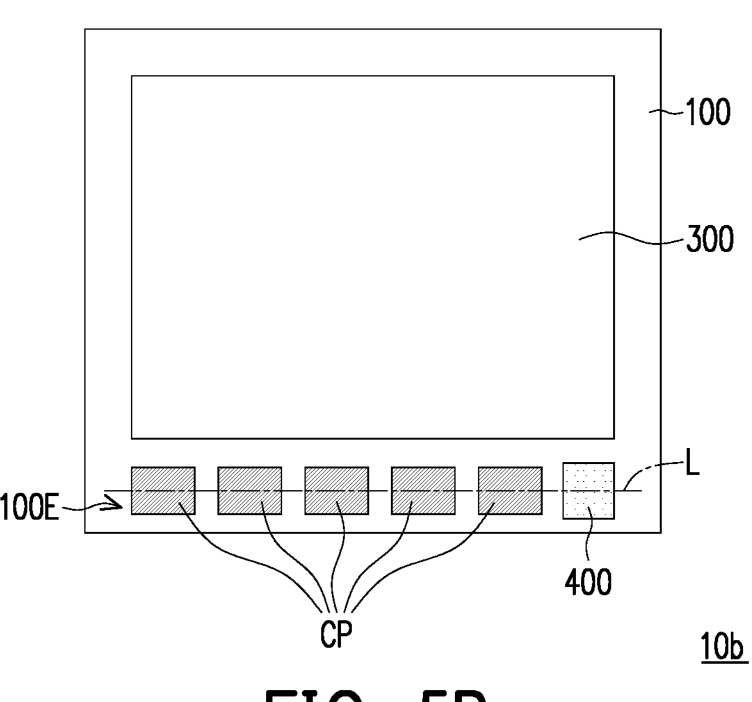
FIG. 5B is a top-view diagram of the semiconductor structure according to another embodiment of FIG. 1.

FIG. 5A is a top-view diagram of the semiconductor structure according to one embodiment of FIG. 1, and FIG. 5B is a top-view diagram of the semiconductor structure according to another embodiment of FIG. 1. It should be noted that the embodiments of FIG. 5A and FIG. 5B may respectively use the reference numbers and portions of the content of the embodiment of FIG. 1, wherein the same or similar reference numbers are used to represent the same or similar elements, and descriptions of the same technical contents are omitted.

Referring to FIG. 5A and FIG. 5B, the semiconductor structure 10*a* (one embodiment of FIG. 1) and the semiconductor structure 10*b* (another embodiment of FIG. 1) further comprise a plurality of contact pads CP formed on the substrate 100.

In detail, the surface 100S of the semiconductor die 100 comprises the plurality of contact pads CP formed thereon, and the PSRAM die 400 and the plurality of contact pads CP substantially form a straight line L on the edge 100E of the semiconductor structure 10 when viewing to the top of the semiconductor structure 10.

Figure 6A:
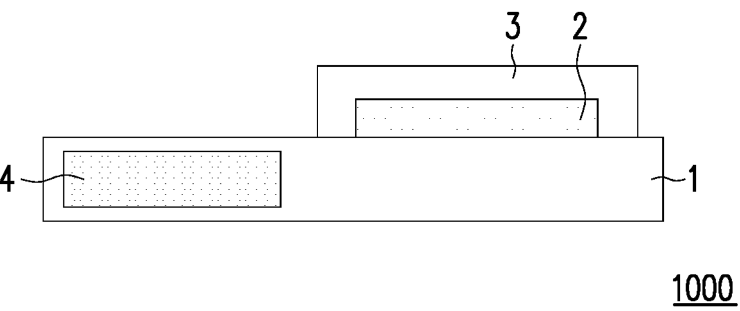
FIG. 6A is a partial cross-sectional schematic diagram of an existing semiconductor structure including an embedded memory.
Figure 6B:
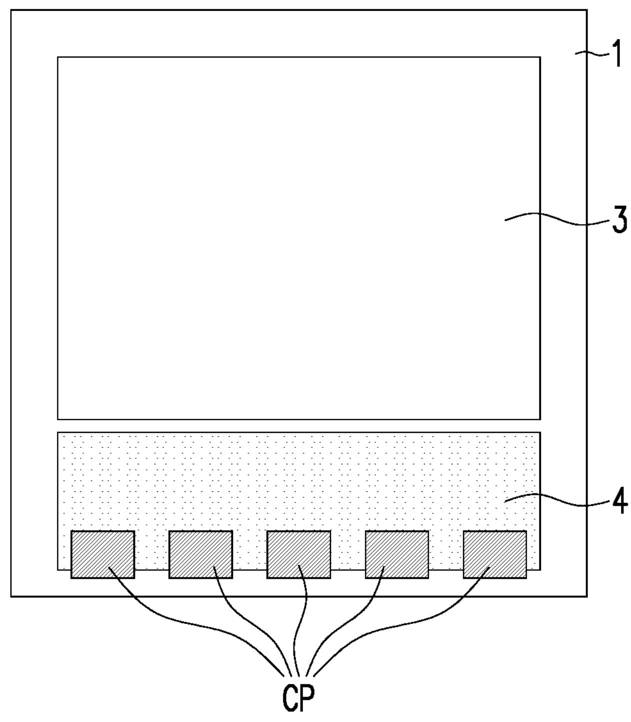
FIG. 6B is a top-view diagram of the existing semiconductor structure according to FIG. 6A.

When comparing with the semiconductor structure 1 shown in FIG. 6B, the semiconductor structure 10*a* may have larger glass area (on which the component layer 200 disposed) and the semiconductor structure 10*b* may have smaller size since the PSRAM die 400 is attacked to the semiconductor die 100 other than embedded in the semiconductor die 100.

In summary, by attaching the PSRAM die to the semiconductor die, the size and/or performance of the integrated circuit in the semiconductor die may not be limited. Namely, the semiconductor structure provided by the disclosure have smaller size and/or better performance. Furthermore, the memory integrated in the semiconductor structure provided by the disclosure is the PSRAM, which has the advantages including the low cost and large capacity of DRAM and the operating interface of SRAM, so the semiconductor structure has the reduced power consumption.

It is noted that, in the above description, the "active surface" (also known as a face side) of a die means a surface on which a back-end-of-line (BEOL) is formed, and the opposite side of the active surface is the semiconductor substrate, i.e., the back side of the die. For the purpose of illustration, FIG. 7 shows a definition of a face side and a back side of a semiconductor die or a semiconductor wafer. For a semiconductor structure 80 (e.g. the PSRAM die 400 in FIG. 1) or a wafer (e.g. the PSRAM wafer 400*a* in FIG. 3), the semiconductor structure 80 may comprise a semiconductor substrate 83 and a back-end-of-line (BEOL) structure 85, in which a front-end-of-line (FEOL) structure 84 is formed in/on the semiconductor substrate 83. Memory devices or semiconductor devices may be formed in the semiconductor substrate 83. According to the embodiments, the surface of the BEOL structure 85 may be the face side 81 of the semiconductor structure 80, and the surface opposite to the surface of the BEOL structure 85 of the semiconductor substrate 83 may be the back side 82 of the semiconductor structure 80. However, this is not a limitation of the present embodiments. The definition of the face side and the back side of a semiconductor structure may be switched.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure, comprising:

a semiconductor die;

a component layer, disposed on a surface of the semiconductor die, wherein the component layer comprises an organic layer; and a pseudo static random access memory (PSRAM) die, disposed on the surface of the semiconductor die and electrically connected to the semiconductor die.

2. The semiconductor structure according to claim 1, wherein the semiconductor die comprises a display driver integrated circuit (DDIC), the DDIC is arranged to drive the component layer by using the PSRAM die.

3. The semiconductor structure according to claim 1, wherein a keep out zone is formed between the PSRAM die and the component layer for separating the component layer from the PSRAM die by air.

4. The semiconductor structure according to claim 1, wherein the component layer comprises a plurality of microorganic light-emitting diodes, and the semiconductor die is arranged to control the microorganic light-emitting diodes by accessing the PSRAM die.

5. The semiconductor structure according to claim 1, wherein the PSRAM die comprises a first surface and a second surface, the first surface attaches to the surface of the semiconductor die, the surface of the semiconductor die has a plurality of first contact pads formed thereon, the second surface has a plurality of second contact pads formed thereon, and the semiconductor structure further comprises:

a plurality of metal wires arranged to bond the plurality of second contact pads to the first contact pads.

6. The semiconductor structure according to claim 5, further comprising a molding layer, wherein the molding layer covers the plurality of first contact pads of the semiconductor die and the plurality of second pads of the PSRAM die, and surrounds the metal wires.

7. The semiconductor structure according to claim 5, wherein the semiconductor die is arranged to access the PSRAM die through the metal wires.

8. The semiconductor structure according to claim 1, wherein the surface of the semiconductor die has a plurality of first contact pads formed thereon, and the semiconductor structure further comprises:

a plurality of bumps formed on a surface of the PSRAM die; and a conductive film formed on the plurality of first contact pads;

wherein the PSRAM die electrically connects to the semiconductor die through the plurality of bumps and the conductive film.

9. The semiconductor structure according to claim 8, further comprising an encapsulation layer, wherein the encapsulation layer is disposed on the semiconductor die, and surrounds the PSRAM die and the plurality of bumps.

10. The semiconductor structure according to claim 1, wherein the surface of the semiconductor die further comprises a plurality of contact pads formed thereon, and the PSRAM die and the plurality of contact pads substantially form a straight line on an edge of the semiconductor structure when viewing to the top of the semiconductor structure.

11. A manufacturing method of a semiconductor structure, comprising:

providing a pseudo static random access memory (PSRAM) wafer;

dicing the PSRAM wafer to form a plurality of PSRAM dies;

bonding the PSRAM die to a surface of a semiconductor die, wherein a component layer and a passivation layer are disposed on the surface of the semiconductor die, and the component layer comprises an organic layer.

12. The manufacturing method of the semiconductor structure according to claim 11, further comprising:

performing a wire bonding process to bond a plurality of second contact pads disposed on the PSRAM die to a plurality of first contact pads disposed on the surface of the semiconductor die.

13. The manufacturing method of the semiconductor structure according to claim 12, wherein performing the wire bonding process comprises:

bonding the PSRAM die to the semiconductor die are through an adhesive layer disposed on a first surface of the PSRAM die, wherein the first surface is opposite to an active surface of the PSRAM die, and the adhesive layer is cured at a temperature below 100° C.; and forming a plurality of metal wires electrically connected to the plurality of second contact pads of the PSRAM die and corresponding first contact pads of the semiconductor die.

14. The manufacturing method of the semiconductor structure according to claim 13, wherein after forming the plurality of metal wires, and the manufacturing method further comprises:

forming a molding layer to cover the plurality of first contact pads of the semiconductor die and the plurality of second contact pads of the PSRAM die, and the molding layer surrounds the plurality of metal wire, wherein the molding layer is cured at a temperature below 100° C.

15. The manufacturing method of the semiconductor structure according to claim 11, further comprising:

forming a plurality of bumps disposed on an active surface of the PSRAM die before dicing the PSRAM wafer, wherein the active surface is opposite to a first surface of the PSRAM die.

16. The manufacturing method of the semiconductor structure according to claim 15, further comprising:

performing a flip-chip bonding process to bond the plurality of bumps disposed on the PSRAM die to a plurality of first contact pads disposed on the surface of the semiconductor die.

17. The manufacturing method of the semiconductor structure according to claim 16, wherein performing the flip-chip bonding process comprises:

forming a conductive film covering the plurality of first contact pads disposed on the surface of the semiconductor die; and laminating the PSRAM die to the conductive film at a temperature of approximately 140° C., wherein the active surface of the PSRAM die faces the surface of the semiconductor die.

18. The manufacturing method of the semiconductor structure according to claim 16, wherein after dicing the PSRAM wafer and before performing the flip-chip bonding process, the manufacturing method further comprises:

disposing the plurality of PSRAM dies on a temporary substrate, wherein the first surface of the plurality of PSRAM dies faces the temporary substrate;

forming an encapsulation layer on the temporary substrate to form an encapsulation structure, wherein the encapsulation structure comprises the plurality of PSRAM dies and the encapsulation layer, and the encapsulation layer surrounds the plurality of PSRAM dies and exposed a portion of the plurality of bumps;

separating the encapsulation structure from the temporary substrate; and cutting the encapsulation structure to form the plurality of PSRAM dies surrounded by the encapsulation layer.

19. The manufacturing method of the semiconductor structure according to claim 11, wherein the semiconductor die comprises a display driver integrated circuit (DDIC), and the component layer comprises a plurality of microorganic light-emitting diodes.

20. The manufacturing method of the semiconductor structure according to claim 11, further comprising:

forming a keep out zone between the PSRAM die and the component layer.

* * * * *